United States Patent
Lin et al.

(10) Patent No.: US 7,177,155 B2
(45) Date of Patent: Feb. 13, 2007

(54) SEMICONDUCTOR PACKAGE WITH HEAT SINK

(75) Inventors: Chang-Fu Lin, Taichung (TW); Han-Ping Pu, Taichung (TW); Cheng-Hsu Hsiao, Taichung (TW); Chien Ping Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 11/212,290

(22) Filed: Aug. 26, 2005

(65) Prior Publication Data

US 2005/0280132 A1 Dec. 22, 2005

Related U.S. Application Data

(62) Division of application No. 10/441,604, filed on May 19, 2003, now abandoned.

(30) Foreign Application Priority Data

Mar. 4, 2003 (TW) .............................. 92104505 A

(51) Int. Cl.
*H05K 7/20* (2006.01)
*H01L 23/34* (2006.01)

(52) U.S. Cl. ...................... 361/704; 257/706; 257/707; 257/712; 257/713; 361/710; 361/719; 361/708

(58) Field of Classification Search ............... 361/704, 361/707, 708, 710; 257/706–707, 712–713; 438/108
See application file for complete search history.

(56) References Cited

U.S. PATENT DOCUMENTS

| | | | |
|---|---|---|---|
| 5,311,402 A | 5/1994 | Kobayashi et al. | |
| 5,345,107 A | 9/1994 | Daikoku et al. | |
| 5,396,403 A | 3/1995 | Patel | |
| 5,587,882 A | 12/1996 | Patel | |
| 5,637,920 A | 6/1997 | Loo | |
| 5,905,636 A | 5/1999 | Baska et al. | |
| 5,926,371 A | 7/1999 | Dolbear | |
| 5,931,222 A | 8/1999 | Toy et al. | |
| 6,011,304 A | 1/2000 | Mertol | |
| 6,407,334 B1 | 6/2002 | Jimarez et al. | |
| 6,538,320 B1 * | 3/2003 | Tosaya et al. | 257/706 |
| 2003/0131975 A1 | 7/2003 | Houle et al. | |
| 2003/0138994 A1 * | 7/2003 | Shim et al. | 438/108 |
| 2004/0040327 A1 | 3/2004 | Iida et al. | |

* cited by examiner

*Primary Examiner*—Greg Thompson
(74) *Attorney, Agent, or Firm*—Peter F. Corless; Steven M. Jensen; Edwards Angell Palmer & Dodge LLP

(57) ABSTRACT

A semiconductor package with a heat sink is provided in which at least one chip is mounted on the substrate and covered by a heat sink. The heat sink is formed with a plurality of grooves or holes at positions in contact with the substrate, allowing an adhesive material to be applied between the heat sink and the substrate and filled into the grooves or holes for attaching the heat sink onto the substrate. The adhesive material filled into the grooves or holes provides an anchoring effect for firmly positioning the heat sink on the substrate. Therefore, it is not necessary to form predetermined holes on the substrate for being coupled to fixing members such as bolts, and incorporation of the heat sink would not affect trace routability and arrangement of input/output connections such as solder balls on the substrate and would not lead to cracks of the chip.

5 Claims, 3 Drawing Sheets

SEMICONDUCTOR PACKAGE WITH HEAT SINK

CROSS-REFERENCE TO RELATED APPLICATION(S)

This application is a divisional of application U.S. Ser. No. 10/441,604, filed on May 19, 2003 now abandoned.

FIELD OF THE INVENTION

The present invention relates to semiconductor packages, and more particularly, to a semiconductor package with a heat sink for improving heat dissipating efficiency of the semiconductor package.

BACKGROUND OF THE INVENTION

A FCBGA (flip-chip ball grid array) semiconductor package is formed with both a flip-chip structure and a ball grid array in which at least one chip is mounted and electrically connected to a surface of a substrate by a plurality of solder bumps, and a plurality of solder balls are implanted on an opposite surface of the substrate to serve as input/output (I/O) connections of the semiconductor package. In order to dissipate heat produced from operation of the chip, a heat sink is normally incorporated in the semiconductor package, as disclosed by U.S. Pat. Nos. 5,311,402, 5,637,920, 5,931,222 and 6,011,304. This heat sink is attached to the substrate by means of an adhesive or solder and is usually greater in surface area than the chip to cover the chip and effectively dissipate the heat from the chip. Further, as to enhance electrical performances of the semiconductor package, at least one passive component can be mounted on the substrate, which however would decrease area on the substrate capable of being in contact with the heat sink, thereby making the heat sink relatively difficult to be firmly adhered and positioned onto the substrate and thus leading to dislocation of the heat sink; this situation becomes severe in the use of a large heat sink. Moreover, attachment between the heat sink and the substrate via the adhesive or solder would be damaged by unsatisfactory cleanness of contact surfaces between the heat sink and the substrate, or by undesirable stress applied to the heat sink and the substrate; in this case, delamination may occur at an interface between the heat sink and the substrate, and as a result, the beat sink is dislocated. Furthermore, when the substrate mounted with the heat sink is subject to external force such as vibration or shock, the heat sink may also be dislocated from the substrate.

Therefore, it has been taught to mount a heat sink on a chip or to mechanically secure a heat sink on a substrate in position. The former is illustrated by U.S. Pat. No. 6,093,961 that a heat sink is directly stacked on and coupled to a flip chip on a substrate; the heat sink is formed with a plurality of flexible legs extending toward the chip, each leg having a hook end. When the heat sink is pressed on an upper surface of the chip, the hook ends of the flexible legs are adapted to be engaged with corners of a lower surface of the chip to securely dispose the heat sink onto the chip. However, this structure is defective that the chip may be damaged if improperly pressing the heat sink onto the chip; further, during a high temperature process or thermal cycle, due to mismatch in coefficient of thermal expansion (CTE) between the heat sink and the chip, the chip may suffer thermal stress and crack.

U.S. Pat. Nos. 5,396,403 and 5,926,371 propose to position the heat sink on the substrate in a mechanical manner that the heat sink is formed with a plurality of holes at positions supposed to be in contact with the substrate that is also formed with a plurality of corresponding holes, and a plurality of fixing members such as bolts are coupled to the holes to connect the heat sink and the substrate. Moreover, in U.S. Pat. No. 6,441,485, extending portions with hook ends are formed at edges of the heat sink and inserted into corresponding holes formed through the substrate, allowing the hook ends to be engaged with the substrate to position the heat sink on the substrate.

However, the above mechanical method of using the fixing members or extending portions for attaching the heat sink onto the substrate renders significant problems. One is that predetermined area on the substrate is required for forming the holes, which may affect trace routability on the substrate and make the substrate not able to be mounted with a full array of solder balls. Besides, formation of the holes would undesirably increase fabrication costs and process complexity of the substrate. Further, external moisture or contaminant may enter the holes of the substrate and thus degrade reliability of fabricated products.

Therefore, the problem to be solved herein is to enhance adhesion between a heat sink and a substrate to securely position the heat sink on the substrate without damaging a chip mounted on the substrate or affecting trace routability on the substrate.

SUMMARY OF THE INVENTION

An objective of the present invention is to provide a semiconductor package with a heat sink, wherein the heat sink is formed with a plurality of grooves or holes at positions in contact with a substrate, allowing an adhesive material to be applied between the heat sink and the substrate and filled into the grooves or holes to thereby attach the heat sink onto the substrate; as such, the adhesive material filled into the grooves or holes provides an anchoring effect to firmly secure the heat sink on the substrate in position.

Another objective of the invention is to provide a semiconductor package with a heat sink, wherein a heat sink is attached to a substrate by means of an adhesive material without having to form holes on a substrate, thereby not affecting trace routability or solder ball arrangement on the substrate.

A further objective of the invention is to provide a semiconductor package with a heat sink by which attachment of a heat sink to a substrate would not lead to cracks of a chip mounted on the substrate.

In accordance with the foregoing and other objectives, the present invention proposes a semiconductor package with a heat sink, including: a substrate having an upper surface and a lower surface opposed to the upper surface; at least one chip mounted on the upper surface of the substrate and electrically connected to the substrate by a plurality of conductive elements; a heat sink mounted on the upper surface of the substrate and covering the chip, the heat sink having a flat portion and a support portion extending from an edge of the flat portion to the substrate, making the flat portion elevated above the chip by the support portion, wherein the support portion is formed with a plurality of grooves or holes at positions in contact with the upper surface of the substrate; an adhesive material applied between the support portion of the heat sink and the upper surface of the substrate and filled into the grooves or holes of the heat sink for attaching the heat sink onto the substrate; and a plurality of solder balls implanted on the lower surface of the substrate.

In another preferred embodiment, the support portion of the heat sink is formed with a plurality of flanges coming into contact with the upper surface of the substrate, and each of the flanges is formed with at least one hole at a position in contact with the substrate, so as to allow the adhesive material to be filled into the holes of the flanges to thereby attach the heat sink onto the substrate.

The above semiconductor package yields significant benefits in the use of a heat sink formed with Grooves or holes, so as to allow an adhesive material to be applied between the heat sink and the substrate and filled into the grooves or holes to thereby securely attach the heat sink onto the substrate. The adhesive material filled into the grooves or holes provides an anchoring effect and thus enhances adhesion between the heat sink and the substrate, making the heat sink firmly held in position on the substrate. Therefore, there is no need to form predetermined holes on the substrate for accommodating conventional fixing members such as bolts used to connect the heat sink and the substrate, such that trace routability and solder ball arrangement on the substrate would not be adversely affected, and thus the substrate can be desirably implanted with a full array of solder balls. Moreover, the substrate flee of holes prevents the entrance of external moisture or contaminant and thereby eliminates reliability issues. In addition, the heat sink is mounted on the substrate instead of on the chip, thereby preventing chip cracks which occur in the prior art with the heat sink being directly stacked on and coupled to the chip.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a semiconductor package with a heat sink proposed in the present invention are described with reference to FIGS. 1, 2, 3A–3B, 4 and 5A–5D.

First Preferred Embodiment

Figure 1:
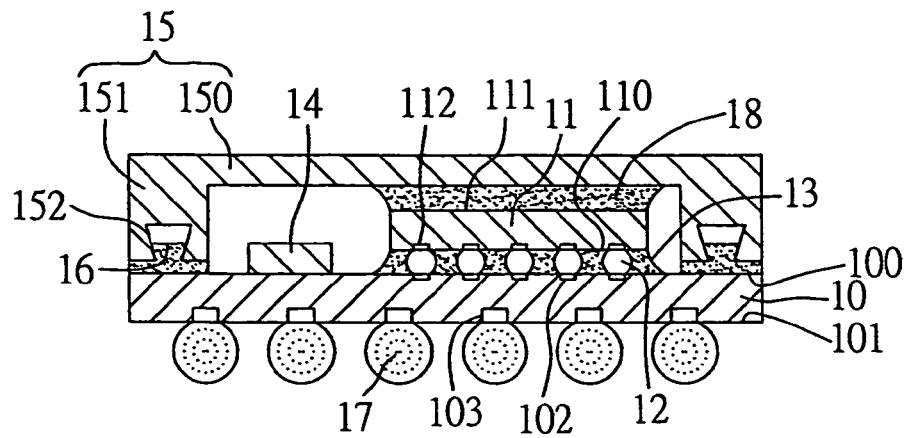
FIG. 1 is a cross-sectional view of a semiconductor package according to a first preferred embodiment of the invention.

FIG. 1 illustrates a semiconductor package according to a first preferred embodiment of the invention. As shown in the drawing, this semiconductor package uses a substrate 10 as a chip carrier primarily made of a conventional resin material such as epoxy resin, polyimide resin, BT (Bismaleimide Triazine) resin, FR4 resin, etc.

The substrate 10 has an upper surface 100 and a lower surface 101 opposed to the upper surface 100. The upper surface 100 of the substrate 10 is formed with a plurality of bond pads 102 at predetermined positions where solder bumps 12 are bonded, and the lower surface 101 of the substrate 10 is formed with a plurality of ball pads 103 for being implanted with solder balls 17. The substrate 10 is fabricated by conventional processes which are not to be further detailed herein.

At least one chip 11 is prepared, having an active surface 110 where electronic elements and circuits (not shown) are disposed and a non-active surface 111 opposed to the active surface 110. The active surface 110 of the chip 11 is formed with a plurality of bond pads 112 corresponding in position to the bond pads 102 of the substrate 10, so as to allow the active surface 110 of the chip 11 to be electrically connected to the upper surface 100 of the substrate 10 by means of a plurality of solder bumps 12 whose two ends are respectively bonded to the bond pads 102, 112. The use of solder bumps for mediating chip-substrate electrical connection is customarily named flip-chip technology, which can beneficially shorten the electrical connection pathway between the chip and the substrate and thereby assure quality of electrical performances.

It is preferable to apply an insulating material 13 (such as resin, etc.) between the chip 11 and the substrate 10 to fill gaps between adjacent solder bumps 12 and thus encapsulate the solder bumps 12 so as to enhance bondability between the chip 11 and the substrate 10. This gap-filling method is customarily referred to as underfill technology, which can be performed by dispensing the insulating material and allowing the insulating material to fill the gaps between adjacent solder bumps by virtue of capillarity; the underfill technology is well known in the art and not to be further described herein.

Moreover, optionally at least one passive component 14 (such as capacitor, etc.) can be mounted on the upper surface 100 of the substrate 10 at area free of the solder bumps 12 or chip 11 to improve electrical performances of the semiconductor package.

A heat sink 15 is provided on the upper surface 100 of the substrate 10 and the non-active surface 11 of the chip 11 with the use of an adhesive (such as thermally conductive adhesive) 18 for attaching the heat sink 15 to the chip 11. The chip 11 and the passive component 14 are covered by the heat sink 15 to be protected against damage from external moisture and contaminant. As a result, heat produced from operation of the chip 11 can be dissipated via the thermally conductive adhesive 18 and the heat sink 15, thereby improving heat dissipating efficiency of the semiconductor package. The heat sink 15 has a flat portion 150 and a support portion 151 extending from an edge of the flat portion 150 to the substrate 10, making the flat portion 150 elevated above the chip 11 by the support portion 151. The support portion 151 of the heat sink 15 is formed with a plurality of grooves 152 at positions in contact with the upper surface 100 of the substrate 10. As shown in FIG. 1, the grooves 152 each has a mouth smaller than a dead end thereof and has a cross section of an inverse trapezoid shape; preferably at least two symmetrically arranged grooves 152 are provided, or the grooves 152 can be formed at peripheral positions on the heat sink 15.

An adhesive material 16 such as adhesive or solder is applied between the support portion 151 of the heat sink 15 and the upper surface 100 of the substrate 10. Appropriate pressure is exerted to allow the adhesive material 16 to fill into the grooves 152 of the heat sink 15. Then, a baking process is performed to cure the adhesive material 16, which thereby provides an anchoring effect to firmly secure the heat sink 15 on the substrate 10 in position.

A plurality of solder balls 17 are implanted at the ball pads 103 on the lower surface 101 of the substrate 10 and serve as input/output (I/O) connections to be electrically connected to an external device such as printed circuit board (not shown), whereby the chip 11 can be electrically coupled to the printed circuit board via the solder balls 17 and operate. This thereby completes fabrication of the semiconductor package according to the invention.

In this embodiment, the grooves 152 would not be exposed on the appearance of the heat sink 15, thereby not affecting the overall external profile of the semiconductor package. Moreover, application of the adhesive material 16 between the heat sink 15 and the substrate 10 adopts conventional technology, thereby not increasing fabrication costs and process complexity.

Second Preferred Embodiment

Figure 2:
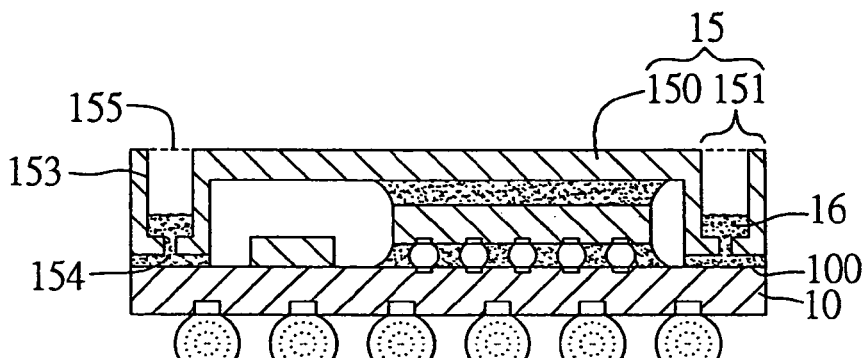
FIG. 2 is a cross-sectional view of the semiconductor package according to a second preferred embodiment of the invention.
Figure 3A:
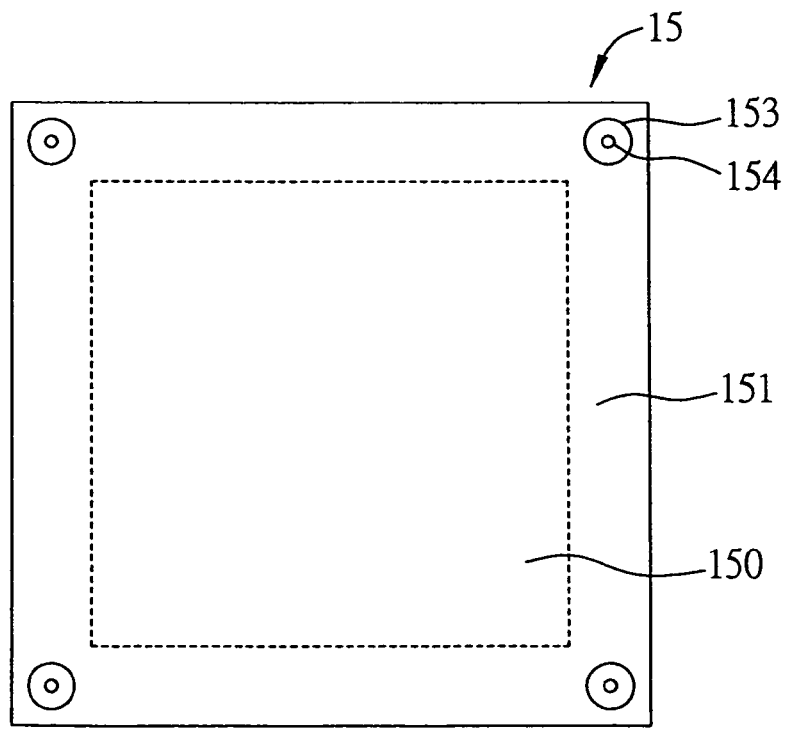
FIG. 3A is a top view of a heat sink used in the semiconductor package shown in FIG. 2.

FIG. 2 illustrates a semiconductor package according to a second preferred embodiment of the invention. As shown in the drawing, this semiconductor package is structurally similar to that of the first preferred embodiment, with the difference in that the support portion 151 of the heat sink 15 is formed with a plurality of holes 153 at positions in contact with the upper surface 100 of the substrate 10 and vertically penetrating through the support portion 151. Each of the holes 153 has a first opening 154 directed toward the substrate 10 and a second opening 155 opposed to the first opening 154, with the first opening 154 being preferably smaller in diameter than the second opening 155. As shown in FIG. 3A, the holes 153 are preferably provided at corner positions of the heat sink 15. Further referring to FIG. 2, the hole 153 of the heat sink 15 is of a step-like structure with a portion relatively closer to the first opening 154 being constricted via a step portion to form the smaller first portion 154. The adhesive material 16 is applied between the support portion 151 of the heat sink 15 and the upper surface 100 of the substrate 10 and squeezed to fill into the holes 153 of the heat sink 15 through the first openings 154 to the second openings 155, and then is cured to form a bolt structure that provides an locking effect to strongly attach the heat sink 15 onto the substrate 10.

Figure 3B:
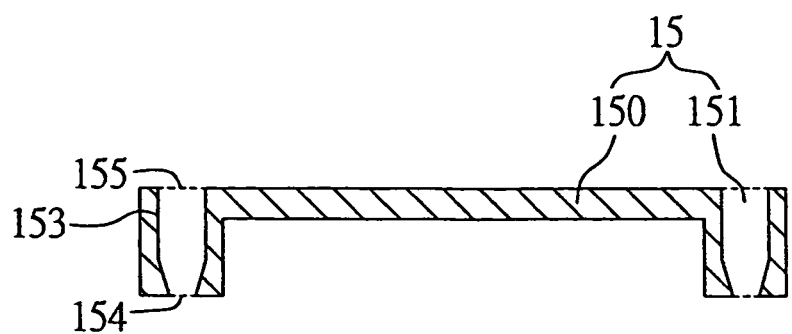
FIG. 3B is a cross-sectional view of another example of the heat sink used in the semiconductor package shown in FIG. 2.

Moreover, as shown in FIG. 3B, the hole 153 of the heat sink 15 can be formed as a conical or taper shaped with the diameter thereof being decreased from the second opening 155 to the first opening 154, thereby making the first opening 154 acting as a tip or narrow end of the bole 153.

Third Preferred Embodiment

Figure 4:
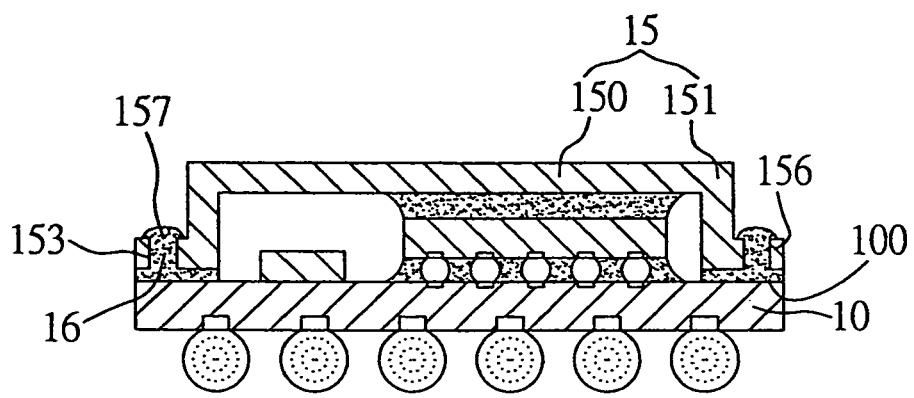
FIG. 4 is a cross-sectional view of the semiconductor package according to a third preferred embodiment of the invention.
Figure 5A:
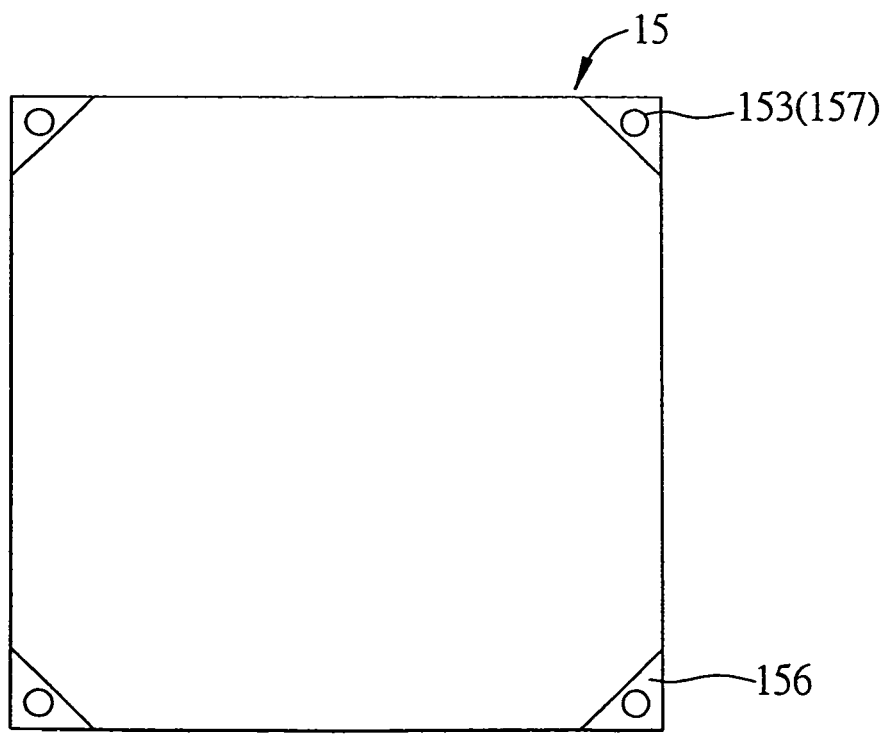
FIG. 5A is a top view of a heat sink used in the semiconductor package shown in FIG. 4.
Figure 5B:
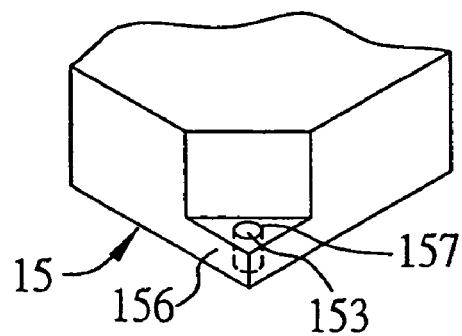
FIG. 5B is a partial enlarged view of the eat sink used in the semiconductor package shown in FIG. 4.

FIG. 4 illustrates a semiconductor package according to a third preferred embodiment of the invention. As shown in the drawing, this semiconductor package structurally differs from that of the first preferred embodiment in that the support portion 151 of the heat sink 15 is formed with a plurality of flanges 156 coming into contact with the upper surface 100 of the substrate 10, and the flanges 156 are preferably situated at corner positions of the heat sink 15 (as shown in FIG. 5A). The holes 153 of the heat sink 15 are formed to penetrate through the flanges 156, allowing part of the upper surface 100 of the substrate 10 to be exposed to the holes 153 of the flanges 156, as shown in FIG. 5B. Thereby, the adhesive material 16 is applied between the flanges 156 of the heat sink 15 and the upper surface 100 of the substrate 10 and squeezed to fill into the holes 153 of the flanges 156 so as to securely mount the heat sink 15 on the substrate 10.

As one end opening 157 of the hole 153 penetrating through the flange 156 is exposed on the appearance of the heat sink 15, an applying amount of the adhesive material 16 can be easily monitored in a manner that, when the adhesive material 16 leaks out of the opening 157 of the hole 153, it indicates that a sufficient amount of the adhesive material 16 is applied between the heat sink 15 and the substrate 10 and filled in the hole 153, and thus no more adhesive material 16 is required.

Figure 5C:
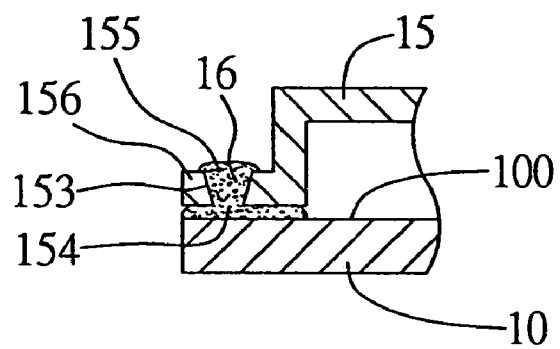
FIG. 5C is a cross-sectional view of another example of the heat sink used in the semiconductor package shown in FIG. 4.
Figure 5D:
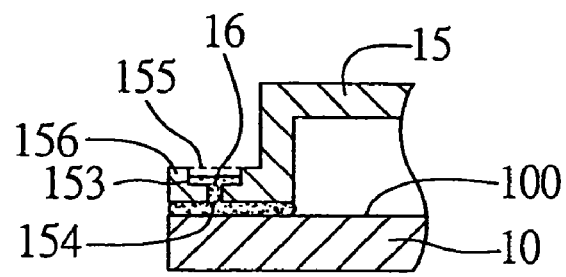
FIG. 5D is a cross-sectional view of a further example of the heat sink used in the semiconductor package shown in FIG. 4.

Besides, the holes 153 formed through the flanges 156 of the heat sink 15 can be of a conical shape (FIG. 5C) or a step-like structure (FIG. 5D). As shown in FIG. 5C, the conical hole 153 has a first opening 154 directed toward the substrate 10 and a second opening 155 opposed to the first opening 154 and is constricted toward the first opening 154, making the first opening 154 smaller in diameter than the second opening 155. As shown in FIG. 5D, the step-like hole 153 has a first opening 154 directed toward the substrate 10 and a second opening 155 opposed to the first opening 154, with a portion thereof relatively closer to the first opening 154 being constricted via a step portion to make the first portion 154 smaller in diameter than the second opening 155. And, the adhesive material 16 applied between the flanges 156 and the substrate 10 is squeezed via the first openings 154 into the holes 153 of the heat sink 15.

The above semiconductor package yields significant benefits in the use of a heat sink formed with grooves or holes, so as to allow an adhesive material to be applied between the heat sink and the substrate and filled into the grooves or holes to thereby securely attach the heat sink onto the substrate. The adhesive material filled into the grooves or holes provides an anchoring effect and thus enhances adhesion between the heat sink and the substrate, making the heat sink firmly held in position on the substrate. Therefore, there is no need to form predetermined holes on the substrate for accommodating conventional fixing members such as bolts used to connect the heat sink and the substrate, such that trace routability and solder ball arrangement on the substrate would not be adversely affected, and thus the substrate can be desirably implanted with a full array of solder balls. Moreover, the substrate free of holes prevents the entrance of external moisture or contaminant and thereby eliminates reliability issues. In addition, the heat sink is mounted on the substrate instead of on the chip, thereby preventing chip cracks which occur in the prior art with the heat sink being directly stacked on and coupled to the chip.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should accord with the broadest interpretation so as to encompass all such modifications and similar arrangements.

What is claimed is:

1. A semiconductor package, comprising:
a substrate having an upper surface and a lower surface opposed to the upper surface;
at least one chip mounted on the upper surface of the substrate and electrically connected to the substrate by a plurality of conductive elements;
a heat sink mounted on the upper surface of the substrate and covering the chip, the heat sink having a flat portion and a support portion extending from an edge of the flat portion to the substrate, making the flat portion elevated above the chip by the support portion, wherein the support portion is formed with a plurality of holes at positions in contact with the upper surface of the substrate, and each of the holes vertically penetrates through the support portion of the heat sink and has a first opening directed toward the substrate and a second opening opposed to the first opening, with the first opening being smaller in diameter than the second opening;
an adhesive material applied between the support portion of the heat sink and the upper surface of the substrate and filled into the holes of the heat sink for attaching the heat sink onto the substrate; and
a plurality of solder balls implanted on the lower surface of the substrate.

2. The semiconductor package of claim 1, further comprising: at least one passive component mounted on the upper surface of the substrate at area free of the chip and covered by the heat sink.

3. The semiconductor package of claim 1, wherein the adhesive material is selected from the group consisting of an adhesive and solder.

4. The semiconductor package of claim 1, wherein the conductive elements are solder bumps, allowing an active surface of the chip to be electrically connected to the upper surface of the substrate by the plurality of solder bumps.

5. The semiconductor package of claim 4, wherein an insulating material is applied between the chip and the substrate to fill gaps between adjacent solder bumps.

* * * * *